United States Patent [19]
Yao et al.

[11] Patent Number: 6,097,048
[45] Date of Patent: Aug. 1, 2000

[54] DYNAMIC RANDOM ACCESS MEMORY CELL SUITABLE FOR INTEGRATION WITH SEMICONDUCTOR LOGIC DEVICES

[75] Inventors: Chingchi Yao; Chung-Jen Chien, both of Saratoga; Thomas Chao, Cupertino, all of Calif.

[73] Assignee: Oki Semiconductor, Sunnyvale, Calif.

[21] Appl. No.: 09/218,303

[22] Filed: Dec. 22, 1998

[51] Int. Cl.[7] .................................................. H01L 27/108
[52] U.S. Cl. ............................................ 257/296; 257/532
[58] Field of Search .................................. 257/296, 306, 257/386, 595, 532

[56] References Cited

U.S. PATENT DOCUMENTS 5,282,159   1/1994   Ueda et al. .............................. 365/149
5,949,706   9/1999   Chang et al. ........................... 365/156

*Primary Examiner*—David Hardy
*Attorney, Agent, or Firm*—Jones Volentine, L.L.P.

[57] ABSTRACT

A dynamic random access memory (DRAM) cell includes first and second MOS transistors, such as a PMOS transistor and NMOS transistor in a CMOS cell. One of the two transistors functions as a switch transistor while the other transistor is configured as a storage capacitor. The DRAM cell may be integrated into a logic device, such as a CMOS gate array, using PMOS and NMOS transistor cells formed in the gate array. In that case, the DRAM cell may be fabricated in a logic device with the standard processes used to produce the logic device.

14 Claims, 7 Drawing Sheets

DYNAMIC RANDOM ACCESS MEMORY CELL SUITABLE FOR INTEGRATION WITH SEMICONDUCTOR LOGIC DEVICES

BACKGROUND OF THE INVENTION

1) Field of the Invention

This invention pertains to the field of semiconductor memory devices, and more particularly, to a Dynamic Random Access Memory (DRAM) cell produced of semiconductor transistor structures common to semiconductor logic devices.

2) Background of the Related Art

Semiconductor memory devices may be largely divided into Read Only Memories (ROMs) and Random Access Memories (RAMs), such as Dynamic RAMs (DRAMs) and Static RAMs (SRAMs). RAMs, also referred to as volatile memories because the stored data is destroyed with the passage of time upon removal of the power supply, allow rapid data storage and data retrieval.

Although they must be refreshed, DRAMs generally allow a higher integration density than SRAMs, which have more transistors and generally occupy more area.

FIG. 1 shows a circuit diagram for a DRAM device 100. A word line 110 is connected to a gate 115 of a transistor 120. The transistor has a source 125 connected with a bit line 130 and a drain 135 connected with one side of a capacitor 140. The other side of the capacitor 140 is connected with a fixed potential 175.

The transistor 120 may be, for example, a PMOS transistor. In that case, the fixed potential 175 is ground potential. To program the DRAM device 100 with a potential $V_{DD}$, the word line 110 is connected with the ground potential and the bit line 130 is connected with the power supply potential, $V_{DD}$. To read the DRAM device, the word line 110 is connected with the ground potential and the bit line voltage is sensed.

Alternatively, the transistor 120 may be an NMOS transistor. In that case, the fixed potential 175 is a supply potential $V_{DD}$. To program the DRAM device 100 with the ground potential, the word line 110 is connected with the supply potential $V_{DD}$ and the bit line 130 is connected with the ground potential. To read the DRAM device, the word line 110 is connected with the supply potential $V_{DD}$ and the bit line voltage is sensed.

A number of different memory cell structures have been used for a DRAM device. Generally, design goals include producing a DRAM cell which occupies a small area (to facilitate high scale integration) and providing an adequate capacitance to allow the memory refresh rate to be lower.

FIG. 2 shows one configuration of a stacked capacitor DRAM 200 according to the prior art. First and second impurity regions 225 and 235 are formed in a top surface of the semiconductor substrate 205. A bit line 230 is formed and connected to the first impurity region 225. A word line is connected to a gate electrode 215 arranged above and between the first and second impurity regions. The second impurity region 235 is connected with a stacked capacitor 240, comprised of a first electrode 242 a dielectric layer 244 and a second electrode 246. The capacitor 240 is stacked on top of the second impurity region 235.

FIG. 3 shows one configuration of a trench capacitor DRAM 300 according to the prior art. First and second impurity regions 325 and 335 are formed in a top surface of the semiconductor substrate 305. A bit line 330 is formed and connected to the first impurity region 325. A word line is connected to a gate electrode 315 arranged above and between the first and second impurity regions. The second impurity region 335 is connected with a stacked capacitor 340, comprised of a first electrode 342 a dielectric layer 344 and a second electrode 346. The capacitor 340 is formed in a trench cut into the semiconductor substrate at the second impurity region.

Disadvantageously, these prior art DRAM memory cell structures are not readily adaptable to integration in a logic device such as a gate array.

For instance, a CMOS gate array device typically comprises pairs of NMOS and PMOS transistors. In turn each transistor pair comprises an NMOS transistor formed in a P-well and a PMOS transistor formed in an N-well, where the wells are separated by field oxide regions. Processes used to produce the trench capacitor or stack capacitor are typically not performed in the production of such a CMOS gate array device. Yet, it is desirable to provide dynamic random access memory cells in a gate array device.

Accordingly, it would be advantageous to provide a DRAM cell which may be easily integrated into a semiconductor logic device. It would also be advantageous to provide a DRAM cell which may be easily integrated into a gate array logic device. It would be further advantageous to provide a DRAM cell which can use the same process technologies and array structures which are used to manufacture gate array logic circuitry. Other and further objects and advantages will appear hereinafter.

SUMMARY OF THE INVENTION

The present invention comprises a DRAM cell constructed from MOS transistor structures.

In one aspect of the invention, a DRAM cell includes first and second MOS transistors. One of the two transistors functions as a switch transistor while the other transistor is configured as a storage capacitor. In a preferred embodiment, the DRAM cell includes a PMOS transistor and an NMOS transistor in a CMOS cell.

In another aspect of the invention, a DRAM cell may be integrated into a logic device, such as a CMOS gate array, using PMOS and NMOS transistor cells formed in the gate array.

In another aspect of the present invention, a DRAM cell may be fabricated in a logic device with the standard processes normally used to produce such a logic device.

DESCRIPTION OF THE PREFERRED EMBODIMENTS

Figure 1:
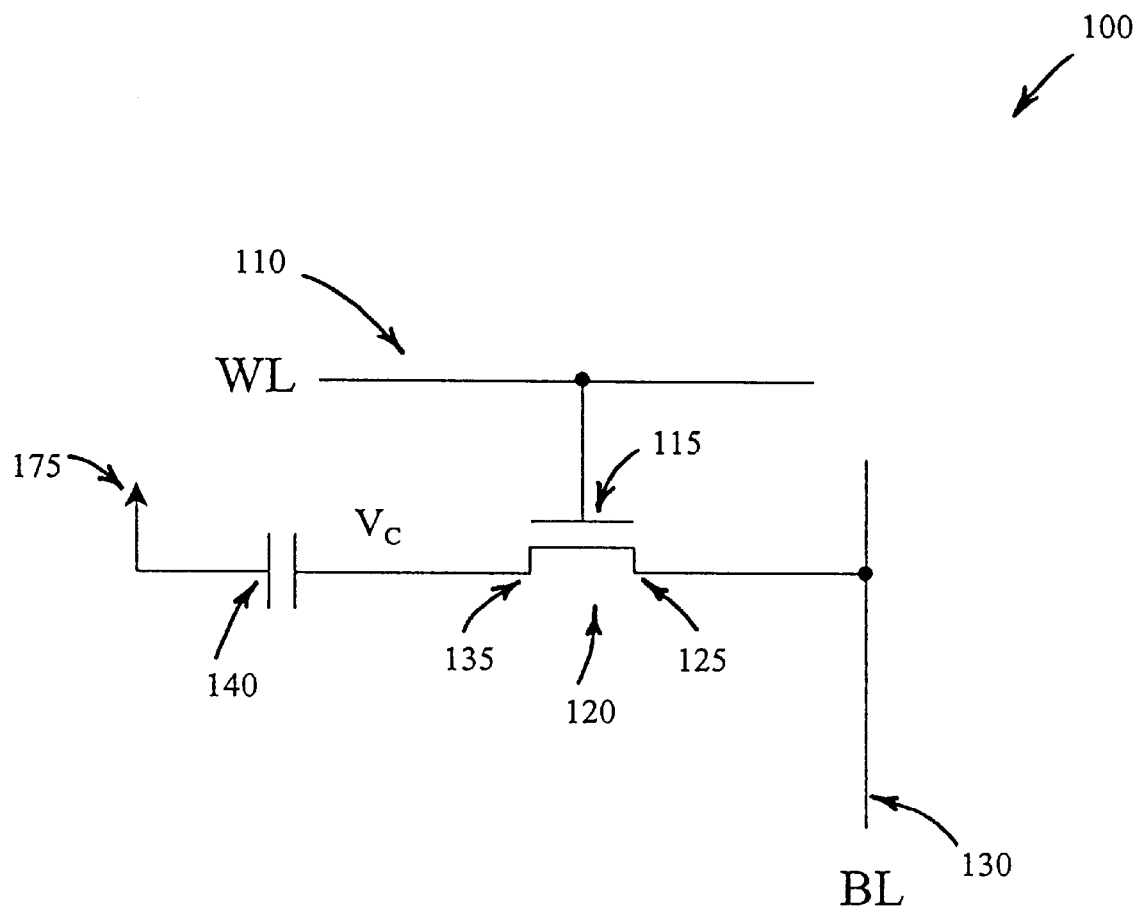
FIG. 1 is a circuit diagram of a dynamic random access memory cell device.
Figure 2:
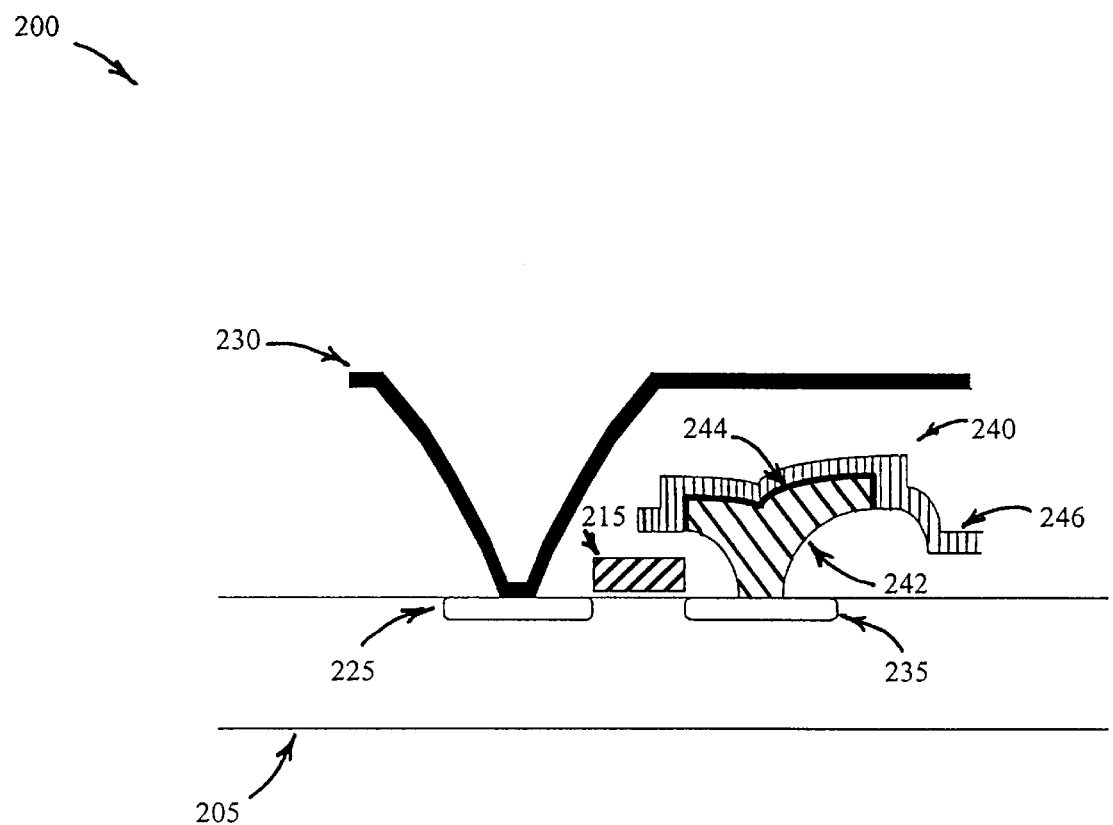
FIG. 2 shows conventional stacked capacitor dynamic random access memory cell.
Figure 3:
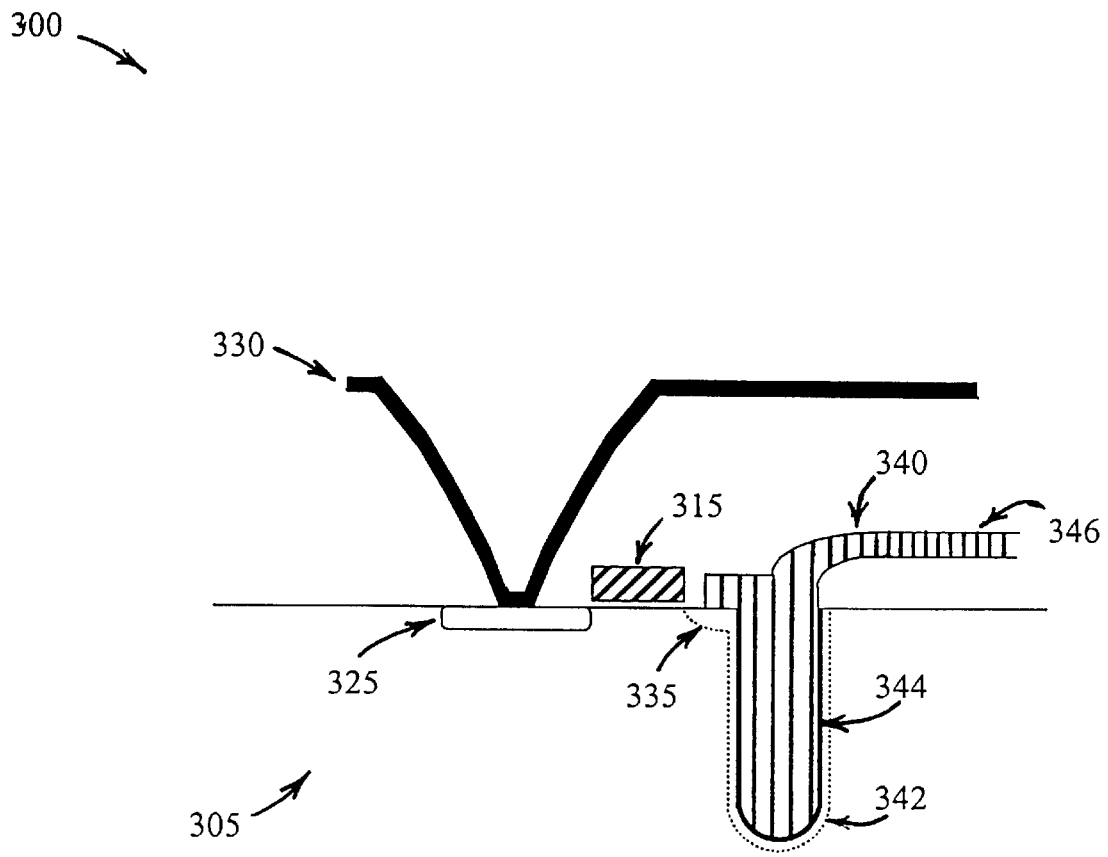
FIG. 3 shows conventional trench capacitor dynamic random access memory cell.
Figure 4:
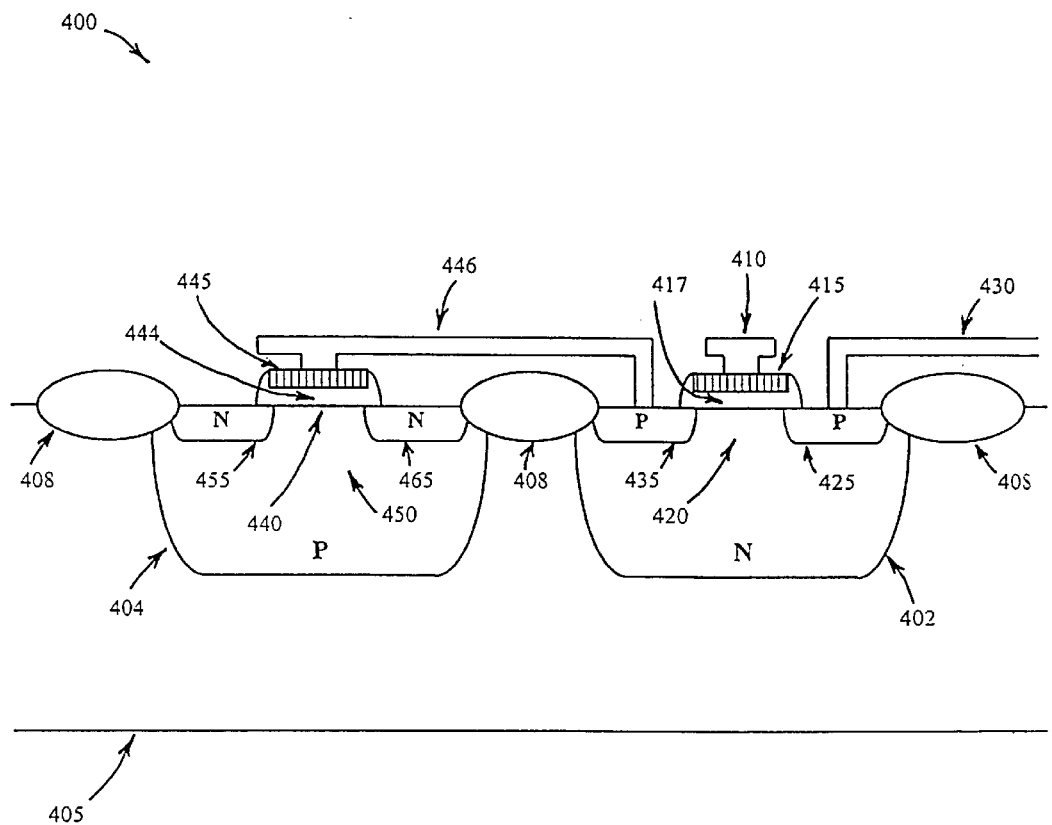
FIG. 4 shows a dynamic random access memory cell according to a first preferred embodiment of the present invention.

A first preferred embodiment of a DRAM cell structure is shown in FIG. 4.

In the preferred embodiment of FIG. 4, a DRAM cell 400 comprises an N-well 402 and a P-well 404 formed in a top surface of a semiconductor substrate 405 and separated by a field oxide 408. A first impurity region 425 and a second impurity region 435, each doped with a P-type impurity, are formed in a top surface of the N-well 402. A gate electrode 415 is formed on an oxide film 417 above and between the impurity regions, producing a PMOS transistor 420.

A bit line 430 is formed and connected to the first impurity region 425. A word line 410 is connected to the gate electrode 415.

The P-well 404 also has formed in a top surface a first impurity region 455 and a second impurity region 465, each doped with an N-type impurity. A gate electrode 445 is formed on an oxide layer 444 above and between the impurity regions 455 and 465, producing an NMOS transistor 450.

A metalization layer 446 is formed above the field oxide region 408. The metalization layer 446 connects the second impurity region 435 of the PMOS transistor 420 with the gate electrode 445 of the NMOS transistor 450.

Also, the P-well 404 is connected with a fixed potential. In the memory cell 400, the fixed potential is ground. This can be accomplished in a variety of ways, including, e.g., tying a heavily doped surface region of the P-well 404 to ground, or, in the case where the substrate 405 is a P-type substrate, grounding the backside of the substrate 405. Thus, a capacitor 440 is formed of the metalization layer 446 and gate electrode 445, the oxide layer 444 and the P-well 404. Thus, a DRAM memory cell 400 is formed from a CMOS structure comprising a PMOS and NMOS transistor appropriately fabricated and connected together.

In a preferred embodiment, the DRAM cell may be formed in a gate array device comprising a plurality of PMOS and NMOS transistors formed in N-wells and P-wells in a top surface of a semiconductor substrate.

Figure 5:
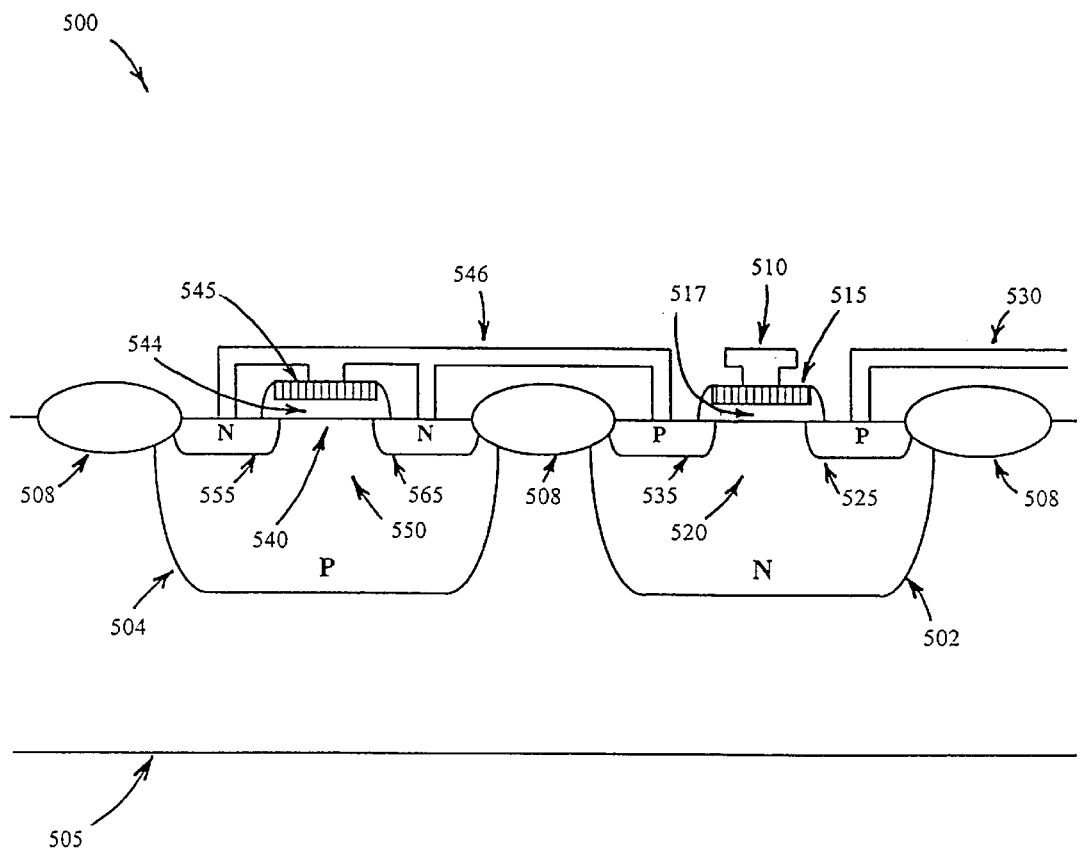
FIG. 5 shows a dynamic random access memory cell according to a second preferred embodiment of the present invention.

A second preferred embodiment of a DRAM cell structure is shown in FIG. 5. The DRAM cell 500 is similar to the DRAM cell 400 described above with respect to FIG. 4, with the addition of connections between the metalization layer 546 and the first and second impurity regions 555 and 565 of the P-well 504. The additional connections increase the total capacitance of the capacitor 540 by adding the additional N+/P junction capacitances at the first and second impurity regions 555 and 565.

Figure 6:
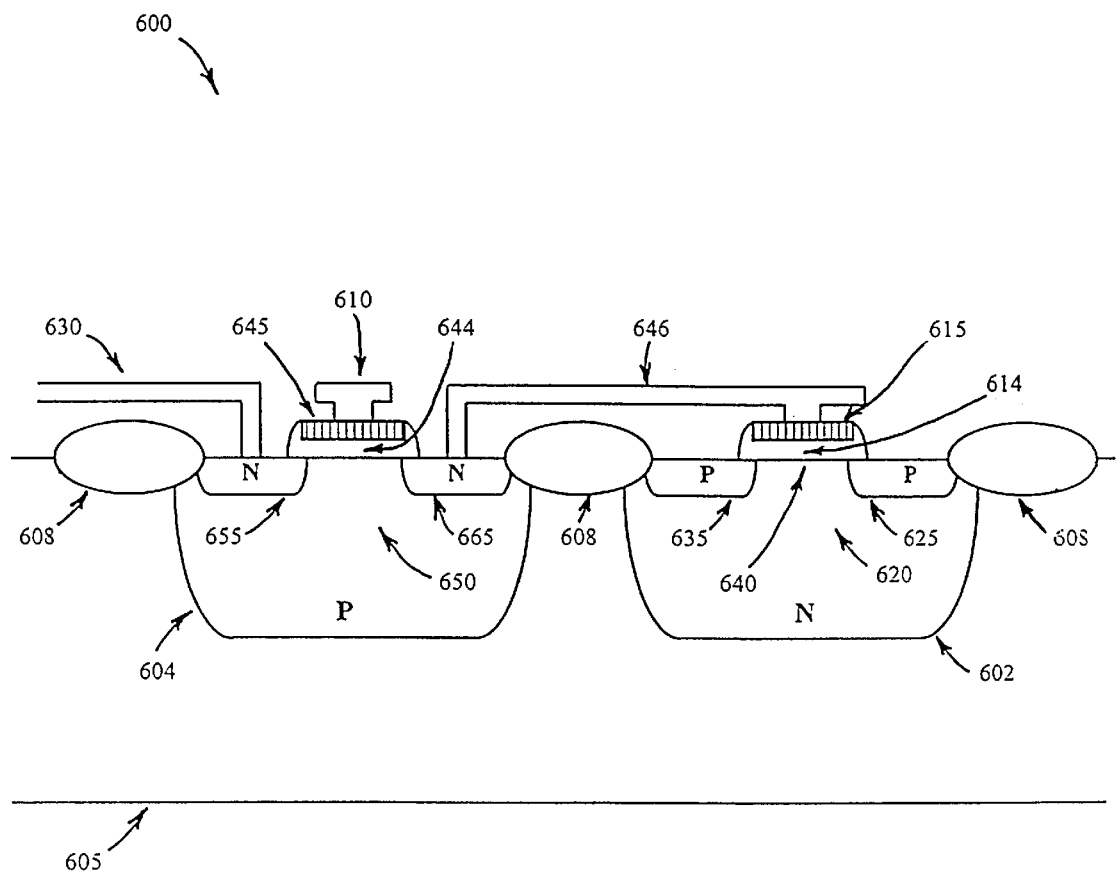
FIG. 6 shows a dynamic random access memory cell according to a third preferred embodiment of the present invention.

A third preferred embodiment of a DRAM cell structure is shown in FIG. 6. In the preferred embodiment of FIG. 6, a DRAM cell 600 comprises an N-well 602 and a P-well 604 formed in a top surface of a semiconductor substrate 605 and separated by a field oxide 608. A first impurity region 655 and a second impurity region 665, each doped with an N-type impurity, are formed in a top surface of the P-well 604. A gate electrode 645 is formed on an oxide film 644 above and between the impurity regions, producing an NMOS transistor 650.

A bit line 630 is formed and connected to the first impurity region 655. A word line 610 is connected to the gate electrode 645.

The N-well 602 also has formed in a top surface a first impurity region 625 and a second impurity region 635, each doped with a P-type impurity. A gate electrode 615 is formed on an oxide layer 614 above and between the impurity regions 625 and 635, producing a PMOS transistor 620.

A metalization layer 646 is formed above the field oxide region 608. The metalization layer 646 connects the second impurity region 665 of the NMOS transistor 650 with the gate electrode 615 of the PMOS transistor 620.

Also, the N-well 602 is connected with a fixed potential. In the memory cell 600, the fixed potential is a supply voltage $V_{DD}$. Thus, a capacitor 640 is formed of the metalization layer 646 and gate electrode 615, the oxide layer 614 and the N-well 602. Thus, a DRAM memory cell 600 is formed from a CMOS structure comprising a PMOS and NMOS transistor appropriately fabricated and connected together.

Figure 7:
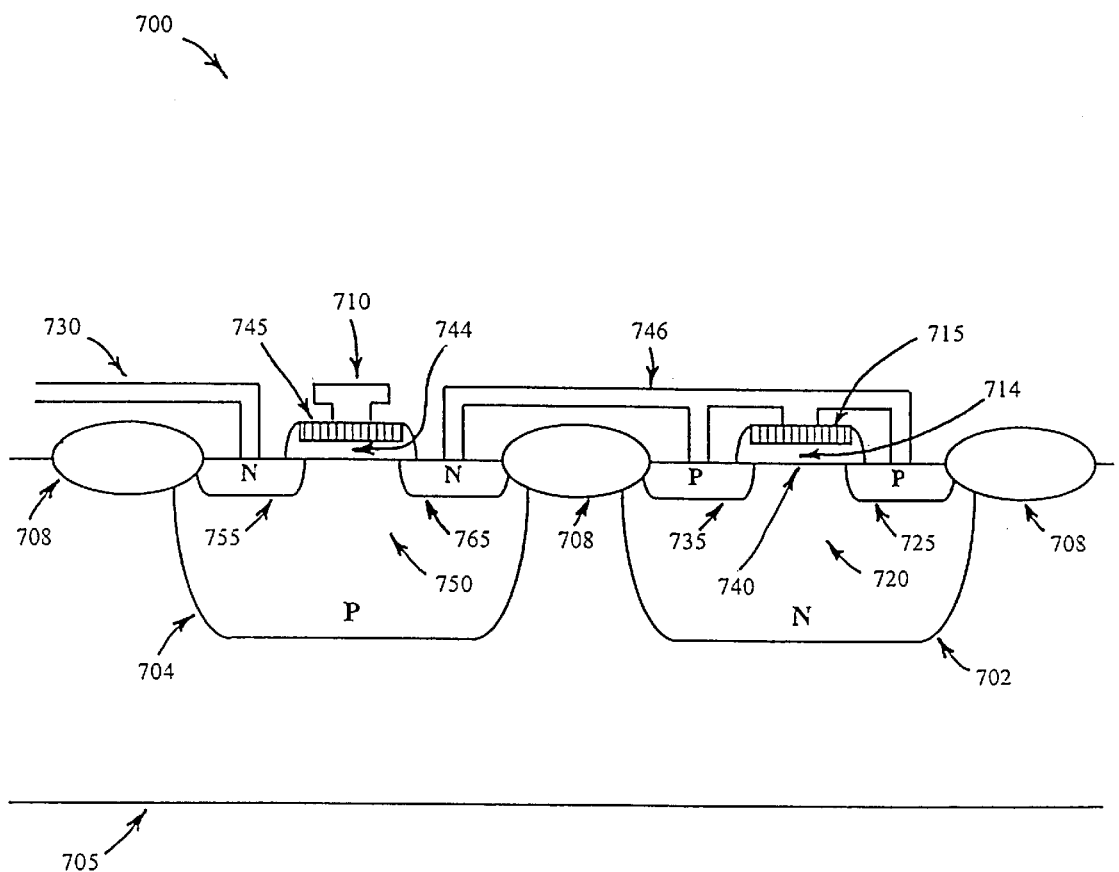
FIG. 7 shows a dynamic random access memory cell according to a fourth preferred embodiment of the present invention.

A fourth preferred embodiment of a DRAM cell structure is shown in FIG. 7. The DRAM cell 700 is similar to the DRAM cell 600 described above with respect to FIG. 6, with the addition of connections between the metalization layer 746 and the first and second impurity regions 725 and 735 of the N-well 702. The additional connections increase the total capacitance of the capacitor 740 by adding the additional P+/N junction capacitances at the first and second impurity regions 725 and 735.

While preferred embodiments are disclosed herein, many variations are possible which remain within the concept and scope of the invention. Such variations would become clear to one of ordinary skill in the art after inspection of the specification, drawings and claims herein. The invention therefore is not to be restricted except within the spirit and scope of the appended claims.

What is claimed is:

1. In a gate array logic device, a dynamic random access memory cell comprising:

a first MOS transistor formed in a top surface of a semiconductor substrate, said transistor having spaced apart first and second impurity regions, each of a first conductivity type, and a gate electrode above and between said first and second impurity regions of the first conductivity type;

a second MOS transistor formed in the top surface of a semiconductor substrate, said transistor having spaced apart first and second impurity regions, each of a second conductivity type, and a gate between said first and second impurity regions of the second conductivity type;

a bit line connected to the first impurity region of the first conductivity type of the first MOS transistor; and a word line connected to the gate electrode of the first MOS transistor, wherein the second impurity region of the first conductivity type of the first MOS transistor is electrically connected with the gate electrode of the second MOS transistor.

2. The dynamic random access memory cell of claim 1, wherein the second impurity region of the first conductivity type is also electrically connected with the first and second impurity regions, each of the second conductivity type, of the second MOS transistor.

3. The dynamic random access memory cell of claim 1, wherein the first MOS transistor is a PMOS transistor and the second MOS transistor in an NMOS transistor.

4. The dynamic random access memory cell of claim 3, wherein the second impurity region of the first conductivity type is also electrically connected with the first and second impurity regions, each of the second conductivity type, of the second MOS transistor.

5. The dynamic random access memory cell of claim 1, wherein the first MOS transistor is an NMOS transistor and the second MOS transistor in a PMOS transistor.

6. The dynamic random access memory cell of claim 5, wherein the second impurity region of the first conductivity type is also electrically connected with the first and second impurity regions, each of the second conductivity type, of the second MOS transistor.

7. A dynamic random access memory cell, comprising:

a semiconductor substrate of a first conductivity type;

a first well portion of a second conductivity type formed in and adjacent to a top surface of said semiconductor substrate;

first and second impurity regions of the first conductivity type formed in the first well portion;

a first gate electrode, formed above and between said first and second impurity regions of the first conductivity type formed in the first well portion;

a word line of said memory cell connected to said first gate electrode;

a bit line of said memory cell connected to said first impurity region of the first conductivity type;

a second well portion of the first conductivity type formed in and adjacent to the top surface of said semiconductor substrate outside of said first well portion;

first and second impurity regions of the second conductivity type formed in the second well portion;

a second gate electrode, formed above and between said first and second impurity regions of the second conductivity type formed in the second well portion; and a metalization layer connecting the second impurity region of the first conductivity type of the first well portion, and the second gate electrode.

8. The dynamic random access memory cell of claim 7, wherein the metalization layer further connects with the first and second impurity regions of the second conductivity type of the second well portion.

9. The dynamic random access memory cell of claim 7, wherein the first impurity is a P-type impurity and the second impurity in an N-type impurity.

10. The dynamic random access memory cell of claim 9, wherein the metalization layer further connects with the first and second impurity regions of the second conductivity type of the second well portion.

11. A dynamic random access memory cell, comprising:

a semiconductor substrate of a first conductivity type;

a first well portion of the first conductivity type formed in and adjacent to a top surface of said semiconductor substrate;

first and second impurity regions of a second conductivity type formed in the first well portion;

a first gate electrode, formed above and between said first and second impurity regions of the second conductivity type formed in the first well portion;

a word line said memory cell connected to said first gate electrode;

a bit line of said memory cell connected to said first impurity region of the second conductivity type;

a second well portion of the second conductivity type formed in and adjacent to the top surface of said semiconductor substrate outside of said first well portion;

first and second impurity regions of the first conductivity type formed in the second well portion;

a second gate electrode, formed above and between said first and second impurity regions of the first conductivity type formed in the second well portion; and a metalization layer connecting the second impurity region of the second conductivity type of the first well portion, and the second gate electrode.

12. The dynamic random access memory cell of claim 11, wherein the metalization layer further connects with the first and second impurity regions of the first conductivity type of the second well portion.

13. The dynamic random access memory cell of claim 11, wherein the first impurity is a P-type impurity and the second impurity in an N-type impurity.

14. The dynamic random access memory cell of claim 13, wherein the metalization layer further connects with the first and second impurity regions of the first conductivity type of the second well portion.

* * * * *